(12) United States Patent
Chidambarrao et al.

(10) Patent No.: US 7,691,712 B2
(45) Date of Patent: Apr. 6, 2010

(54) SEMICONDUCTOR DEVICE STRUCTURES INCORPORATING VOIDS AND METHODS OF FABRICATING SUCH STRUCTURES

(75) Inventors: Dureseti Chidambarrao, Weston, CT (US); Ricardo Alves Donaton, Cortlandt Manor, NY (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 632 days.

(21) Appl. No.: 11/425,588

(22) Filed: Jun. 21, 2006

(65) Prior Publication Data

US 2007/0296039 A1 Dec. 27, 2007

(51) Int. Cl.
*H01L 21/8234* (2006.01)

(52) U.S. Cl. .................... 438/275; 438/279; 438/265; 257/355

(58) Field of Classification Search ......... 438/275–279; 257/355–357
See application file for complete search history.

(56) References Cited

U.S. PATENT DOCUMENTS

| | | | |
|---|---|---|---|
| 5,736,446 A | 4/1998 | Wu | |
| 5,770,507 A | 6/1998 | Chen et al. | |
| 5,869,374 A | 2/1999 | Wu | |
| 5,914,519 A | 6/1999 | Chou et al. | |
| 5,959,337 A | 9/1999 | Gardner et al. | |
| 5,972,761 A | 10/1999 | Wu | |
| 6,001,695 A | 12/1999 | Wu | |
| 6,064,107 A | 5/2000 | Yeh et al. | |
| 6,093,612 A | 7/2000 | Suh | |
| 6,104,077 A | 8/2000 | Gardner et al. | |
| 6,124,177 A | 9/2000 | Lin et al. | |
| 6,180,988 B1 * | 1/2001 | Wu | 257/410 |
| 6,238,987 B1 | 5/2001 | Lee | |
| 6,548,362 B1 | 4/2003 | Wu | |
| 6,894,357 B2 | 5/2005 | Guo | |
| 2001/0045608 A1 | 11/2001 | Tseng et al. | |
| 2005/0037585 A1 | 2/2005 | Park et al. | |
| 2007/0035816 A1 * | 2/2007 | Daamen et al. | 359/360 |

* cited by examiner

*Primary Examiner*—Thinh T Nguyen
(74) *Attorney, Agent, or Firm*—Wood, Herron & Evans, LLP

(57) ABSTRACT

Semiconductor device structures and fabrication methods for field effect transistors in which a gate electrode is provided with an air gap or void disposed adjacent to a sidewall of the gate electrode. The void may be bounded by a dielectric spacer proximate to the sidewall of the gate electrode and a dielectric layer having a spaced relationship with the dielectric spacer. The methods of the invention involve the use of a temporary spacer consisting of a sacrificial material supplied adjacent to the sidewall of the gate electrode, which is removed after the dielectric layer is formed.

26 Claims, 8 Drawing Sheets

SEMICONDUCTOR DEVICE STRUCTURES INCORPORATING VOIDS AND METHODS OF FABRICATING SUCH STRUCTURES

FIELD OF THE INVENTION

The invention relates generally to semiconductor device structures and methods for fabricating semiconductor device structures and, in particular, to semiconductor device structures for field effect transistors that include sidewall voids or air gaps and methods of fabricating such semiconductor device structures.

BACKGROUND OF THE INVENTION

Integrated circuits typically use multiple field effect transistors fabricated using a wafer of semiconductor material. The need to integrate more functionality into an integrated circuit has prompted the semiconductor industry to seek approaches to shrink, or scale, the size of individual field effect transistors and other devices commonly integrated into the integrated circuit. However, scaling devices to smaller dimensions may cause a multitude of undesirable consequences.

Generally, field effect transistors are planar device structures that operate by electronically varying the conductance of the semiconductor material in a channel region along which carriers flow between a source region and drain regions also defined in the semiconductor material and separated by the channel region. In n-channel field effect transistors of complementary metal-oxide-semiconductor device pairs or structures, electrons are responsible for conduction in the channel, and in p-channel field effect transistors of complementary metal-oxide-semiconductor device structures, holes are responsible for conduction in the channel. Output current is controlled by voltage applied to a gate conductor, which is located above the channel region at a location between the source region and drain region. The gate electrode is insulated from the channel region by a thin intervening gate dielectric, which may be silicon dioxide, and is normally flanked by spacers of a dielectric material that is typically silicon nitride.

One approach for improving the performance of scaled field effect transistors is to strain the crystal lattice in the channel of the transistors with a stressed insulating layer or liner overlying the source/drain regions and gate conductors. A conformal layer of silicon nitride is frequently used as the stress liner. Deposition conditions for the stress liner are selected such that tensile strain is induced in the channel region of n-channel field effect transistors and compressive strain is induced in the channel region of p-channel field effect transistors, in the direction of channel current. Efficient transfer of stress to the channel regions depends upon the stress liner being in close proximity to the peripheral edges of the gate conductors. Unfortunately, silicon nitride and other common stress liner materials have a relatively high dielectric constant that accentuates the parasitic capacitance between the gate electrode and the source/drain regions. Consequently, adding the stress liner conflicts with another goal for maximizing device performance in scaled field effect transistors, namely reducing the parasitic capacitance between the gate electrode and the adjacent source/drain regions. Parasitic capacitance gives rise to a delay in the operation of the field effect transistor and hence, limits the operation speed that can be achieved by the device.

The spacers flanking the gate conductor may be removed to improve the transfer of stress from the liner to the channel regions. However, the sidewalls of the gate conductor and the source/drain diffusions are still separated by the dielectric materials of the liner Other dielectrics having lower permittivity than nitride, such as silicon oxide, may be used for the spacer material to reduce parasitic capacitance. However, to promote effective stress transfer the spacer must be made thin, which is undesirable for low parasitic capacitance. Thus, reducing the parasitic capacitance between the gate electrode and the adjacent source/drain regions and inducing strain in the channel region are competing objectives in the scaling of field effect transistors.

What is needed, therefore, are semiconductor device structures for field effect transistors and methods for fabricating field effect transistors that overcome these and other disadvantages of conventional semiconductor device structures and fabrication methods.

SUMMARY OF THE INVENTION

The present invention is directed generally to semiconductor device structures and fabrication methods for field effect transistors in which the gate electrode is provided with a sidewall air gap or void. The present invention overcomes the problems associated with conventional processes for manufacturing field effect transistors that integrate a sidewall void. The device structures may operate to reduce the parasitic capacitance between the gate electrode and the adjacent source/drain regions and may also permit the effective implementation of a stress liner in conjunction with the sidewall void.

In accordance with an embodiment of the present invention, a semiconductor device structure comprises a gate electrode with a top surface and a sidewall extending from the top surface toward a substrate. A dielectric spacer including a first portion disposed on the sidewall of the gate electrode and a second portion angled relative to the first portion. The second portion is disposed on the substrate adjacent to the sidewall of the gate electrode. A dielectric layer, which extends between the first and second portions of the dielectric spacer, has a spaced relationship with the dielectric spacer to define a void between the dielectric layer and the dielectric spacer.

In accordance with another embodiment of the present invention, a method is provided for fabricating a semiconductor device structure on a substrate of semiconductor material. A gate electrode is formed that includes a top surface and a sidewall extending from the top surface toward the substrate. A dielectric spacer is formed on at least the sidewall of the gate electrode. A temporary spacer of a sacrificial material is formed adjacent to the sidewall of the gate electrode. The temporary spacer is separated from the sidewall by the dielectric spacer. A dielectric layer is formed over the temporary spacer and the temporary spacer is removed to define a void between the dielectric layer and the dielectric spacer.

BRIEF DESCRIPTION OF THE DRAWINGS

The accompanying drawings, which are incorporated in and constitute a part of this specification, illustrate embodiments of the invention and, together with a general description of the invention given above and the detailed description of the embodiments given below, serve to explain the principles of the invention.

DETAILED DESCRIPTION

Figure 1:
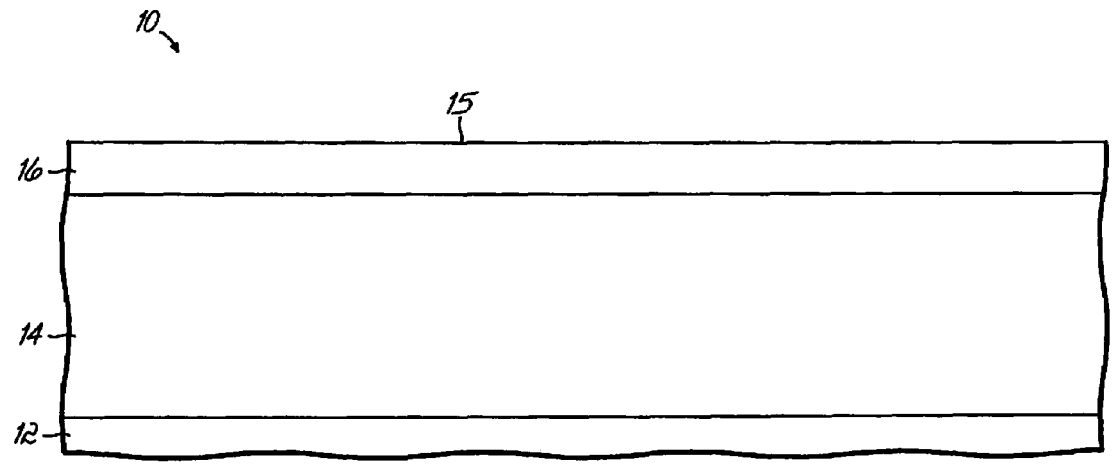
FIGS. 1-7 are diagrammatic cross-sectional views of a portion of a substrate at successive fabrication stages of a processing method in accordance with an embodiment of the present invention.

The present invention is directed generally to semiconductor device structures and fabrication methods for field effect transistors in which the gate electrode is provided with a sidewall air gap or void. The present invention may be readily incorporated into standard CMOS device processes with minimal process changes and no additional masking steps. The sidewall void may reduce the parasitic capacitance between the gate electrode and the adjacent source/drain regions. The sidewall void may be used in combination with a stress liner for inducing strain in the channel region. The semiconductor device structures and methods for fabricating these semiconductor device structures will now be described in greater detail by referring to the drawings that accompany the present application.

With reference to FIG. 1, a silicon-on-insulator (SOI) wafer 10 includes a handle wafer 12, a buried insulating layer 14, and a semiconductor or SOI layer 16 physically separated from the handle wafer 12 by the intervening buried insulating layer 14. The handle wafer 12 may be monocrystalline or single crystal silicon, although the invention is not so limited. The buried insulating layer 14 may consist of a buried silicon dioxide (BOX) layer. The SOI layer 16, which has a top surface 15 and is considerably thinner than the handle wafer 12, may be composed of monocrystalline or single crystal silicon. The buried insulating layer 14 electrically isolates the SOI layer 16 from the handle wafer 12. SOI wafer 10 may be fabricated by any suitable conventional technique, such as a wafer bonding technique or a separation by implantation of oxygen (SIMOX) technique, familiar to a person having ordinary skill in the art.

Figure 2:
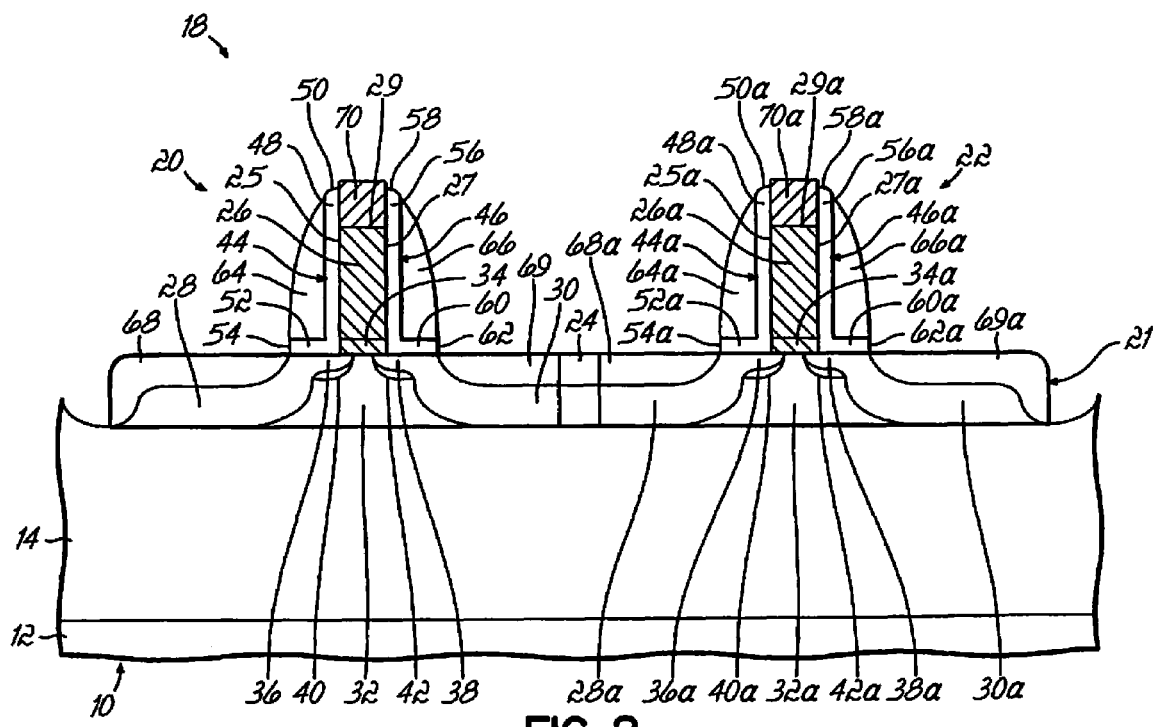

With reference to FIG. 2 in which like reference numerals refer to like features in FIG. 1 and at a subsequent fabrication stage, a device structure 18 includes a representative pair of field effect transistors 20, 22 such as may comprise a complementary metal-oxide-semiconductor (CMOS) pair in a portion of an integrated circuit. The field effect transistors 20, 22 are formed using an electrically isolated substrate or SOI region 21 consisting of the semiconductor material of SOI layer 16 (FIG. 1). The SOI region 21 has a height extending vertically from the buried insulating layer 14 to the top surface 15. The field effect transistors 20, 22 are separated from each other by a shallow trench isolation (STI) region 24 extending through the semiconductor material constituting the SOI region 21 and intersecting the buried insulating layer 14. The STI region 24 is formed by a conventional process understood by a person having ordinary skill in the art.

Field effect transistor 20 includes a gate electrode 26 and heavily doped source/drain diffusions or regions 28, 30 formed in the semiconductor material of the SOI layer 16. Contingent upon the respective applied voltages and the type of device structure (e.g., p-channel field effect transistor, n-channel field effect transistor, etc.), the source/drain region 28 may act as a drain and source/drain region 30 may act as a source, or the converse may apply. The source/drain regions 28, 30 are separated by a channel region 32 also defined in the semiconductor material of the SOI layer 16 at a location beneath the gate electrode 26. The semiconductor material constituting the channel region 32 is typically lightly doped with a dopant of a conductivity type opposite to the conductivity type of the source/drain regions 28, 30. The gate electrode 26 is electrically insulated and physically separated from the channel region 32 by a thin gate dielectric layer 34. The gate electrode 26 is characterized by vertical sidewalls 25, 27 and a top surface 29 connecting the sidewalls 25, 27.

Field effect transistor 20 operates by modulating the conductance of the channel region 32. In operation, the source/drain regions 28, 30 of field effect transistor 20 are electrically biased relative to each other. When a switching voltage exceeding a device threshold voltage is applied to the gate electrode 26, an electric field is created in the semiconductor material of the channel region 32. The conductance of the channel region 32 is modulated by varying the strength of the electric field, which controls the transfer of charge carriers across the channel region 32 between the source/drain regions 28, 30.

The gate electrode 26 and gate dielectric layer 34 are formed by conventional methods understood by a person having ordinary skill in the art. The conductor constituting the gate electrode 26 may be, for example, polysilicon, silicide, metal, or any other appropriate material deposited by a CVD process or another conventional deposition process. The source/drain regions 28, 30 may be formed by implantation or diffusion of a suitable conductivity type dopant, such as arsenic or phosphorous for n-type conductivity or boron for p-type conductivity. The gate dielectric layer 34 may comprise any suitable dielectric or insulating material including, but not limited to, silicon dioxide, silicon oxynitride, a high-k dielectric, or combinations of these dielectrics. The dielectric material constituting gate dielectric layer 34 may be between about one (1) nm and about ten (10) nm thick, and may be formed by thermal reaction of the semiconductor material of the SOI layer 16 with a reactant, a CVD process, a physical vapor deposition (PVD) process, or a combination of these deposition processes.

Shallow source/drain extensions 36, 38 and halo regions 40, 42 are provided in the semiconductor material of the SOI region 21 beneath opposing side edges of the gate electrode 26. Halo regions 40, 42 have an opposite doping polarity or conductivity type in comparison with the shallow source/drain extensions 36, 38 and the source/drain regions 28, 30. The shallow source/drain extensions 36, 38 and the halo regions 40, 42 cooperate for controlling source to drain leakage currents between the source/drain regions 28, 30 when the field effect transistor 20 is quiescent or idle (i.e., switched to an "off" state). The shallow source/drain extensions 36, 38 and halo regions 40, 42 may be formed by angled ion implantation into the SOI region 21. The channel region 32 may also be doped with the same conductivity type as the halo regions 40, 42 for further reducing leakage currents.

Spacers 44, 46, which are formed from a dielectric material, flank the gate electrode 26. The spacers 44, 46, each of which is L-shaped in cross-section when viewed from a perspective in a direction horizontal to the top surface 15, may have a thickness of about three (3) nm to about twelve (12) nm. The dielectric material of spacers 44, 46 may be a low temperature oxide (LTO) that is subsequently densified at an elevated temperature in nitrogen or oxygen ambients, although the invention is not so limited. Suitable conditions for the densification step may be a ten (10) minute anneal at about 800° C. in an oxygen ambient.

Spacer 44 includes a vertical portion 48 disposed coextensively on the previously bare sidewall 25 of the gate electrode 26. The vertical portion 48 terminates at a peripheral edge 50 remote from top surface 15. The peripheral edge 50 of vertical portion 48 projects above the top surface 29 of the gate electrode 26. The vertical portion 48 extends from the peripheral edge 50 to the top surface 15 of SOI region 21. A lateral portion 52 of spacer 44 extends from an intersection with the vertical portion 48 horizontally or parallel to the SOI region 21 and terminates at a peripheral edge 54. The lateral portion 52 intersects the vertical portion 48 near the base of the gate electrode 26 and is oriented at an angle relative to the vertical portion 48. The lateral portion 52 overlaps the source/drain regions 28, 30 adjacent to the base of the gate electrode 26. Spacer 46 includes a vertical portion 56 having a peripheral edge 58 and a lateral portion 60 having a peripheral edge 62 similar, respectively, to the vertical and lateral portions 48, 52 of spacer 50 and peripheral edges 50, 54 of spacer 50.

Spacers 64, 66 are formed that flank the gate electrode 26 and are separated from the constituent material of gate electrode 26 by spacers 44, 46, respectively. The spacers 64, 66 originate from a layer (not shown) of a dielectric material, such as five (5) nm to fifty (50) nm of nitride deposited by CVD, that is shaped by a directional anisotropic etching process, such as a reactive ion etching (RIE) process, that preferentially removes the dielectric material layer from horizontal surfaces.

The source/drain regions 28, 30 include contacts 68, 69, which may be, for example, self-aligned silicide or salicide formed from the constituent semiconductor material of the source/drain regions 28, 30 using a conventional process understood by a person having ordinary skill in the art. An exemplary process includes forming a layer of refractory metal, such as titanium (Ti), cobalt (Co), or nickel (Ni), on a silicon-containing semiconductor material comprising the source/drain regions 28, 30 and heating the metal/silicon-containing material stack by, for example, a rapid thermal annealing process to react the silicon-containing material and refractory metal, and thereafter removing any non-reacted refractory metal. The contacts 68, 69 supply a low resistance electrical connection to the semiconductor constituting the source/drain regions 28, 30, respectively. The gate electrode 26 includes a contact 70, which may be formed by the process forming contacts 68, 69 if the gate electrode 26 is formed of a suitable constituent material.

The contacts 68, 69 are formed after the spacers 44, 46 and spacers 64, 66 are formed. As a result, the peripheral edge or boundary of contact 68 nearest the gate electrode 26 is determined by the peripheral edge 54 of the lateral portion 52 of spacer 44 and the overlying spacer 64. The peripheral edge or boundary of contact 69 nearest the gate electrode 26 is determined by the peripheral edge 62 of the lateral portion 60 of spacer 46 and the overlying spacer 66. Consequently, the contacts 68, 69 are self-aligned with the source/drain regions 28, 30.

Field effect transistor 22 has a construction that is structurally similar to the construction of field effect transistor 20 as understood by a person having ordinary skill in the art. For simplicity in description, corresponding features of field effect transistor 22 are labeled with like reference numerals appended with the suffix "a". One of the field effect transistors 20, 22 may be configured as an n-channel metal-oxide-semiconductor field effect transistor (MOSFET) and the other of the field effect transistors 20, 22 may be configured as a p-channel MOSFET in a CMOS pair. Specifically, in a common device configuration, field effect transistor 20 of the device structure 18 may be configured as an n-channel MOSFET fabricated in a p-type portion of SOI region 21 and having n$^+$-doped source/drain regions 28, 30 and shallow source/drain extensions 36, 38 and p-doped halo regions 40, 42 on opposite sides of an n$^+$-doped polysilicon gate electrode 26 and underlying p-type channel region 32. Field effect transistor 22 may be configured as a p-channel MOSFET fabricated in an n-type portion of SOI region 21 and having p$^+$-doped source/drain regions 28a, 30a and shallow source/drain extensions 36a, 38a and n-doped halo regions 40a, 42a on opposite sides of a p$^+$-doped polysilicon gate electrode 26a and underlying n-type channel region 32a. Typically, n-wells (not shown) defining n-type portions of the SOI region 21 for the P-channel MOSFET's are formed in a p-type SOI layer 16.

Figure 3:
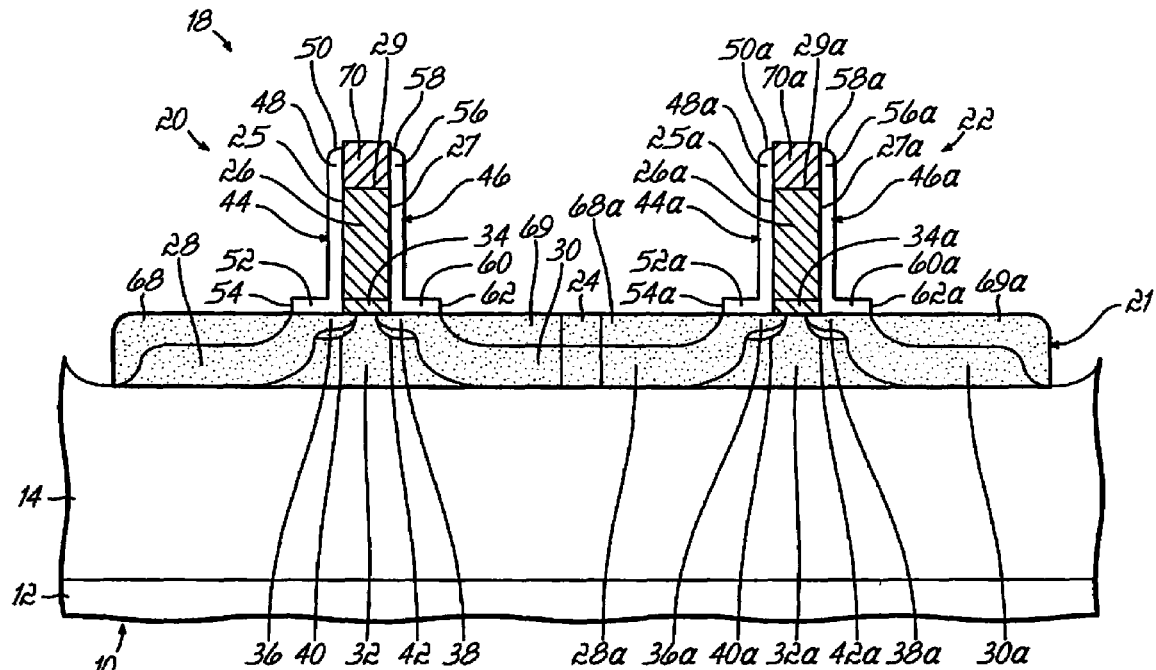

With reference to FIG. 3 in which like reference numerals refer to like features in FIG. 2 and at a subsequent fabrication stage, spacers 64, 66 are removed from the field effect transistor 20, which exposes spacers 44, 46. Similarly, spacers 64a, 66a are removed from the field effect transistor 22, which exposes spacers 44a, 46a. The removal is affected by, for example, a suitable wet chemical etching process that selectively removes the constituent material of spacers 64, 66, 64a, 66a. If the constituent material is silicon nitride, the wet chemical etching process may rely on an aqueous solution of hot phosphoric acid as an etchant. Alternatively, spacers 64, 66 and spacers 64a, 66a may be omitted from the construction of field effect transistors 20, 22, respectively, so that this fabrication stage is not required.

Figure 4:
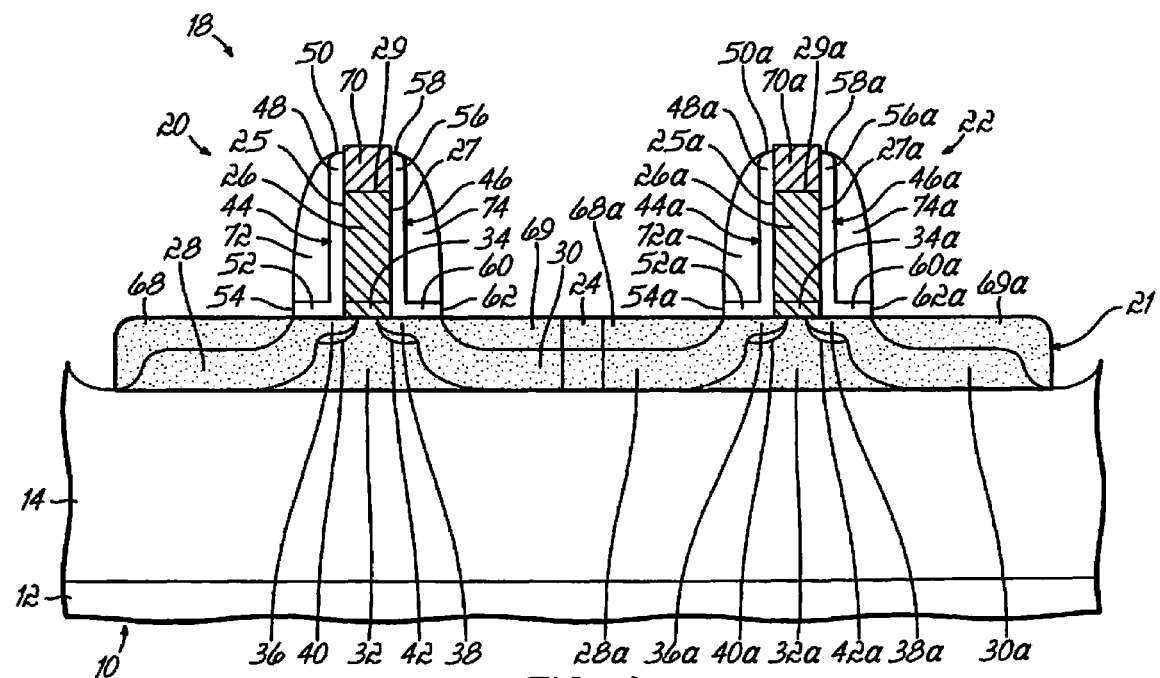

With reference to FIG. 4 in which like reference numerals refer to like features in FIG. 3 and at a subsequent fabrication stage, temporary spacers 72, 74 are formed adjacent to the sidewalls 25, 27 of the gate electrode 26 of field effect transistor 20, respectively. Similarly, temporary spacers 72a, 74a are formed on the sidewalls 25a, 27a of the gate electrode 26a of field effect transistor 22, respectively. The temporary spacers 72, 74, 72a, 74a may be formed by depositing a conformal layer of a sacrificial spacer material, which is subjected to a directional anisotropic etching process, such as a RIE process, to form spacers 72, 74 flanking the sidewalls 25, 27 of gate electrode 26 and spacers 72a, 74a flanking the sidewalls 25a, 27a of gate electrode 26a.

The properties of the sacrificial spacer material forming the temporary spacers 72, 74, 72a, 74a are selected such that the material is converted by decomposition or a phase change from a solid to a gas or vapor to form volatile byproducts. The conversion of the sacrificial spacer material may be prompted, for example, by raising temporary spacers 72, 74, 72a, 74a to an elevated temperature that causes decomposition or a phase change of the sacrificial spacer material. However, other methods are contemplated by the present invention for decomposing the spacer material.

The temporary spacers 72, 74, 72a, 74a may be composed of a polymeric resin or material (i.e., polymer) applied initially as a polymer film by dissolving the polymeric material in solution with a solvent and spin coating the solution across the top surface of the SOI wafer 10. The initial thickness of the polymer film is a function of, among other things, the weight fraction of the polymeric material in solution and the spin speed during spin coating. The initial thickness of the polymer film may range from about 50 nm to about 500 nm. After a baking process removes excess solvent, temporary spacers 72, 74, 72a, 74a are formed by subjecting the polymer film to the directional anisotropic etching process.

One particularly suitable polymeric material is polybutyl-norbornene (PNB), which is copolymer of butylnorbornene and triethoxysilyl (TES) norbornene. The TES component of PNB is recognized to enhance the adhesion of the polymeric material to low temperature oxide. For example, the temporary spacers 72, 74, 72a, 74a may be shaped from a polymer film approximately one (1) mm thick resulting from a ten (10)

percent by weight fraction of PNB in a solution of mesitylene spun-on at a spin speed of approximately 5000 revolutions per minute. The applied polymer film of PNB may be soft-baked at approximately 120° C. for about three (3) minutes to evaporate the solvent. Alternatively, the solvent may be driven out with a low temperature (150° C. to 250° C.) furnace anneal in an inert ambient atmosphere for a duration ranging from about ten (10) minutes to about three (3) hours with the specific time depending on the initial polymer film thickness.

Figure 5:
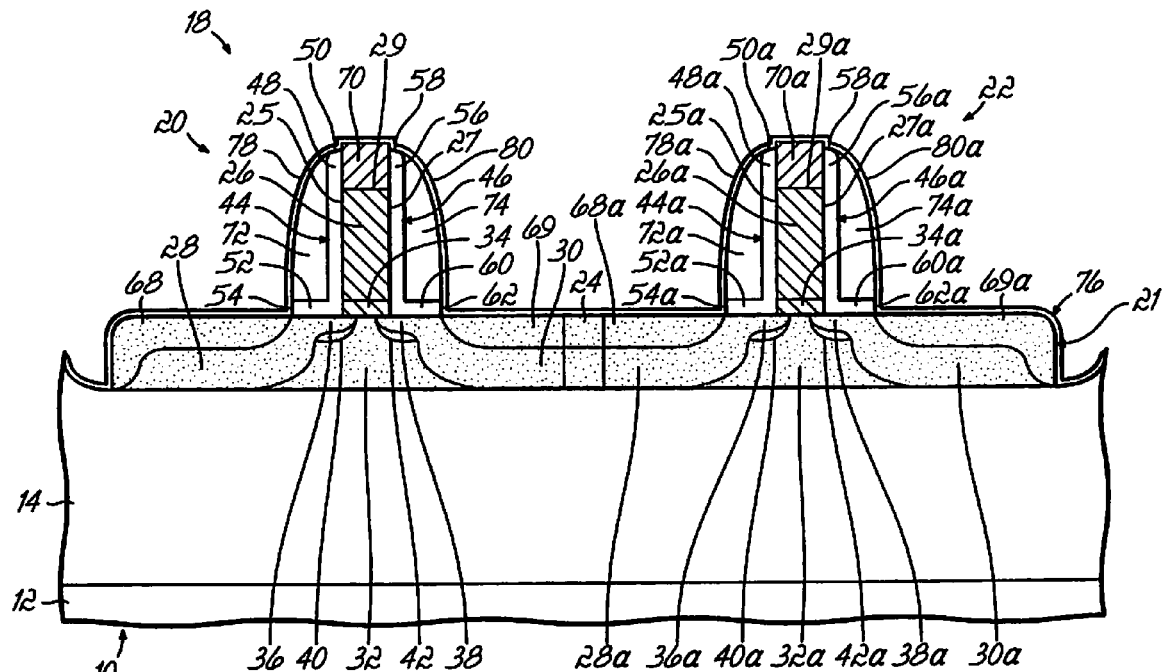

With reference to FIG. 5 in which like reference numerals refer to like features in FIG. 4 and at a subsequent fabrication stage, the temporary spacers 72, 74, 72a, 74a are encapsulated with a thin conformal layer 76 of a porous dielectric material that acquires the geometrical shape of the external surface of the temporary spacers 72, 74, 72a, 74a. The porosity of the dielectric layer 76 allows subsequent diffusion of the volatile byproducts in the gaseous and vapor states from the temporary spacers 72, 74, 72a, 74a during a subsequent fabrication stage. The pores of the dielectric layer 76 are arranged to promote the transfer of the gaseous byproducts through the layer thickness to the surrounding environment about the transistors 20, 22. As will be recognized by a person having ordinary skill in the art of integrated circuit fabrication, a variety of candidate porous dielectric materials are available for use in dielectric layer 76.

A porous dielectric material suitable for use as dielectric layer 76 is a porous dielectric formed by a low temperature CVD or plasma enhanced CVD process. An exemplary CVD process deposits silicon dioxide as a porous material using the reactants silane and nitrous oxide ($N_2O$) diluted in nitrogen carrier gas and a substrate temperature of about 200° C. to form a layer of low temperature oxide having a thickness of about 10 nm to about 20 nm. The particularly low density of low temperature oxide, which is significantly less than the density of fully dense silicon dioxide, allows subsequent diffusion of the volatile gaseous byproducts of the decomposing material of temporary spacers 72, 74, 72a, 74a.

Another porous material suitable for use as dielectric layer 76 is a dielectric material that includes pore generators, i.e. porogens. One such suitable dielectric material comprises a carbon doped oxide, such as the carbon-doped silica glass SiCOH, that contains porogens in a SiOC matrix. Carbon-doped oxides are commercially available under the trade name CORAL® from Novellus Systems, Inc. (San Jose, Calif.).

Dielectric layer 76 has a curved sidewall portion 78 that extends from the peripheral edge 50 of the vertical portion 48 of spacer 44 to the top surface 15 of SOI region 21 adjacent to the peripheral edge 54 of the lateral portion 52 of spacer 44. Dielectric layer 76 also has a curved sidewall portion 80 that extends from the peripheral edge 58 of the vertical portion 56 of spacer 46 to the top surface 15 of SOI region 21 adjacent to the peripheral edge 62 of the lateral portion 60 of spacer 46. Similar considerations apply to sidewall portions 78a, 80a, which are structured substantially identical to sidewall portions 78, 80.

Figure 6:
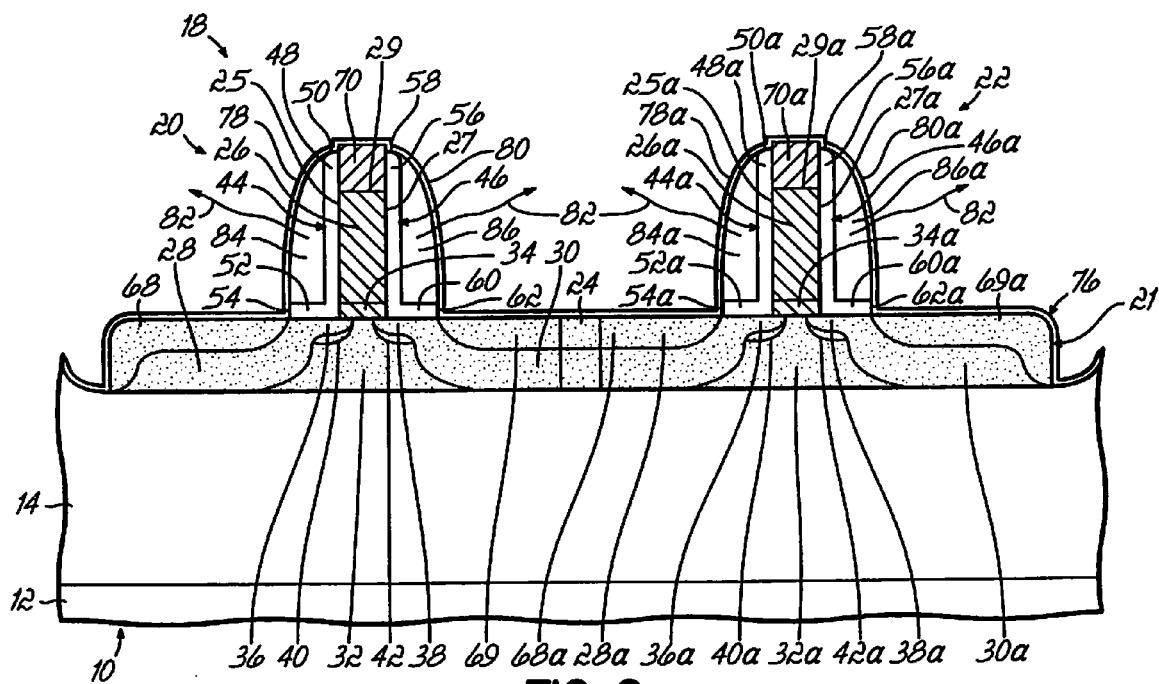

With reference to FIG. 6 in which like reference numerals refer to like features in FIG. 5 and at a subsequent fabrication stage, the temporary spacers 72, 74, 72a, 74a are converted to volatile byproducts by a conversion process that consumes the material constituting the spacers 72, 74, 72a, 74a and converts the material to byproducts 82 comprising vapor and/or gas. For example, the constituent polymeric material of the temporary spacers 72, 74, 72a, 74a may be sublimated by an elevated-temperature anneal having a temperature and duration contingent upon the specific material used to form the spacers 72, 74, 72a, 74a. The volatile byproducts 82 of the converted material of temporary spacers 72, 74, 72a, 74a readily diffuse through the dielectric layer 76. At the conclusion of the removal process, the sacrificial material of temporary spacers 72, 74, 72a, 74a is completely removed or, at the least, almost entirely removed. The sacrificial material is removed without the use of a wet chemical etching process.

The open spaces formerly occupied by the temporary spacers 72, 74 defines air-gaps or voids 84, 86 between the dielectric layer 76 on the sidewalls 25, 27 of gate electrode 26 and layer 76. Similarly, voids 84a, 86a are defined between the dielectric layer 76 on the sidewalls 25a, 27a of gate electrode 26a and layer 76 in the open spaces formerly occupied by temporary spacers 72a, 74a. The voids 84, 86, 84a, 86a are formed after the contacts 68, 69, 70 are formed. The vertical height of the voids 84, 86 extends at least as high as the top surface 29 of the gate electrode 26. Similarly, the vertical height of the voids 84a, 86a extends at least as high as the top surface 29a of the gate electrode 26a.

If the material constituting the temporary spacers 72, 74, 72a, 74a is PNB and dielectric layer 76 is composed of low temperature oxide, an anneal at a temperature of 425° C. for about thirty (30) minutes to about three (3) hours, depending on the thickness of the coating, may be effective to fully remove the spacers 72, 74, 72a, 74a. The polymeric material PNB readily decomposes at 425° C., with the onset of decomposition occurring abruptly as the temperature exceeds 375° C. The anneal also sublimates the decomposed PNB. The volatile byproducts 82 of the PNB diffuse through the dielectric layer 76 of low temperature oxide into the environment surrounding the field effect transistors 20, 22, which may be evacuated to exhaust the volatile byproducts 82. At the conclusion of the anneal, the PNB constituting the temporary spacers 72, 74, 72a, 74a has completely dissociated and the space formerly occupied by the spacers 72, 74, 72a, 74a defines voids 84, 86, 84a, 86a.

If the material constituting the temporary spacers 72, 74, 72a, 74a is PNB and the dielectric layer 76 is composed of carbon doped oxide, an anneal at a temperature between about 400° C. and about 450° C. breaks down the porogens, which diffuse and make the matrix of layer 76 porous. Simultaneously, the PNB comprising the temporary spacers 72, 74, 72a, 74a dissociates and sublimates to form volatile byproducts 82, which diffuse through the porous matrix of dielectric layer 76. Following the anneal, voids 84, 86, 84a, 86a are defined in the space formerly occupied by the temporary spacers 72, 74, 72a, 74a.

Portions of dielectric layer 76 remaining on the horizontal surfaces of the source/drain regions 28, 30 may be optionally removed with a directional anisotropic etching process, such as a RIE process. Removal of portions of dielectric layer 76 overlying the source/drain regions 28, 30 may improve the transfer of stress from a subsequently formed stress layer or liner 88 (FIG. 7) to the underlying semiconductor material in the source/drain regions 28, 30. However, the removal process is controlled to preserve the integrity of the portions of dielectric layer 76 that surround the voids 84, 86, 84a, 86a.

Void 84 is surrounded and enclosed by at least a portion of the sidewall portion 78 of dielectric layer 76 and spacer 44. Void 84 is widest near the base of the gate electrode 26 and overlaps with the lateral portion 52 of spacer 44. Void 84 extends to the peripheral edge 54. Void 84 is narrowest near the top surface 29 of the gate electrode 26 and has a narrowed apex near the peripheral edge 50 of the vertical portion 48 of spacer 44. Similarly, void 86 is surrounded and enclosed by at least a portion of the sidewall portion 80 of dielectric layer 76 and spacer 46. Void 86 is widest near the base of the gate electrode 26 and overlaps with the lateral portion 60 of spacer 46. Void 86 extends to the peripheral edge 62. Void 86 is narrowest near the top surface 29 of the gate electrode 26 and has a narrowed apex near the peripheral edge 58 of the vertical portion 56 of spacer 46. Similar considerations apply to voids 84a, 86a, which are structured substantially identical to voids 84, 86.

Figure 7:
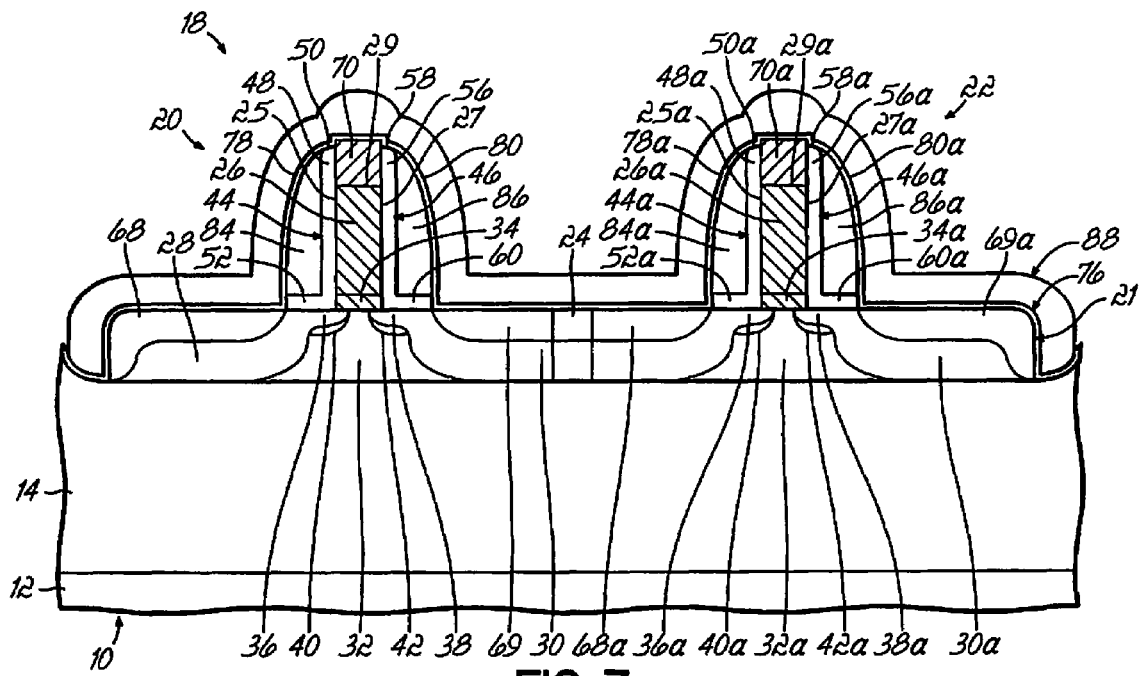

With reference to FIG. 7 in which like reference numerals refer to like features in FIG. 6 and at a subsequent fabrication stage, the stress liner 88 is conformally deposited across the top surface of the SOI wafer 10 to cover the transistors 20, 22. The stress liner 88 covers, or is over, voids 84, 86, the sidewalls 25, 27 and top surface 29 of the gate electrode 26, and the source/drain regions 28, 30 of transistor 20. The stress liner 88 also covers voids 84a, 86a, the sidewalls 25a, 27a and top surface 29a of the gate electrode 26a and the source/drain regions 28a, 30a of transistor 22. The stress liner 88 is either under compressive or tensile stress, which is transferred to the channel regions 32, 32a. The proximity of the stress liner 88 to the sidewalls 25, 27 of the gate electrode 26 and the sidewalls 25a, 27a of the gate electrode 26a is preserved, which promotes efficient stress transfer to the channel regions 32, 32a, respectively. In exemplary embodiments of the present invention, the constituent material of stress liner 88 may be silicon nitride deposited by a CVD, PECVD, or HDP (high density plasma) process in which the deposition process parameters, such as plasma power and gas flow rates, are controlled to introduce stress into the liner 88.

In an embodiment of the present invention, the deposition process forming stress liner 88 may entail the deposition of a first type stress liner, selective removal of the first type stress liner, deposition of a second type stress liner, and selective removal of the second stress liner. A thin etch stop layer may be deposited on the surface of the first type stress liner prior to deposition of the second type stress liner. In this manner, tensile and compressive stress liners may be selectively formed over the transistors 20, 22 to accommodate the fabrication of NFETs and PFETs, respectively.

A dielectric layer (not shown) is deposited over the transistors 20, 22 filling the gaps between the gate electrodes 26, 26a. Additional conventional processing, which may include formation of contact vias and studs (not shown), multilayer patterned metallization (not shown), and interlevel dielectrics (not shown), follows to complete the integrated circuit that includes device structure 18.

Figure 8:
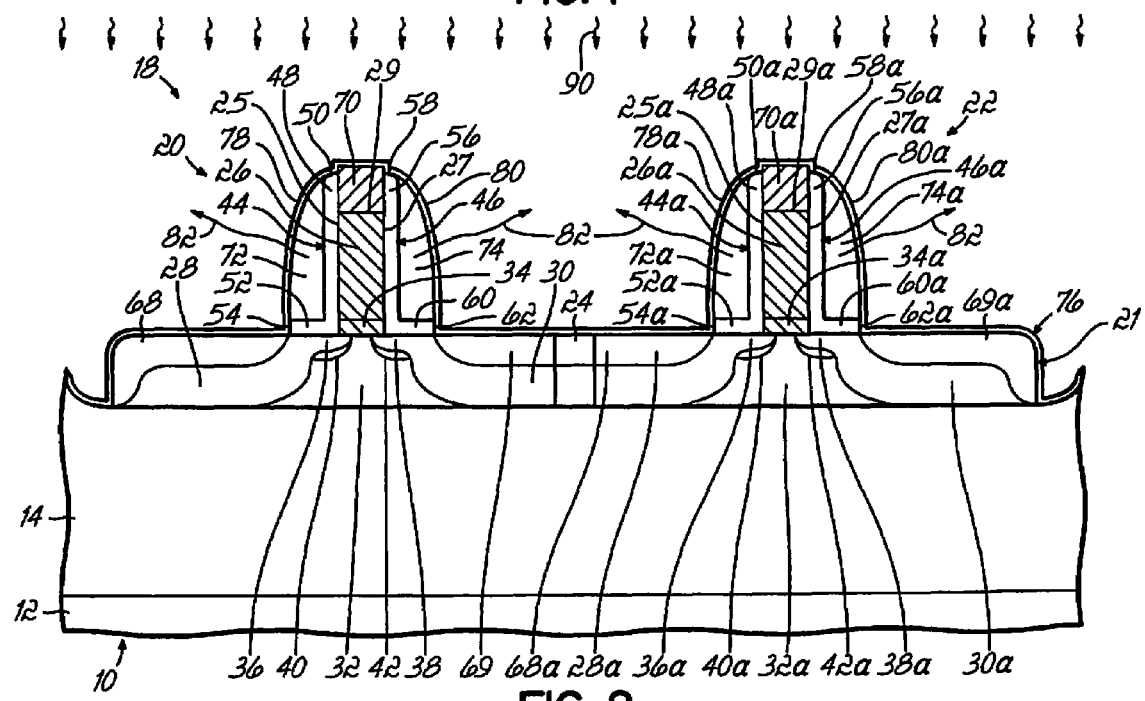
FIG. 8 is a diagrammatic cross-sectional view of a portion of a substrate at a fabrication stage of a processing method in accordance with another embodiment of the present invention.

With reference to FIG. 8 in which like reference numerals refer to like features in FIG. 5 and at a fabrication stage subsequent to FIG. 5 in accordance with an alternative embodiment of the present invention, the material comprising dielectric layer 76 may be modified by the post-deposition exposure to a plasma 90 to provide the requisite porosity. This contrasts with dielectric layer 76 being deposited with sufficient porosity to allow the escape of the volatile byproducts 82 from the converted material constituting the spacers 72, 74, 72a, 74a or to imparting the requisite porosity during the thermal anneal that converts the material constituting the spacers 72, 74, 72a, 74a to volatile byproducts 82. Processing continues with the fabrication stage of FIG. 6.

For example, a conformal layer of carbon doped oxide, such as SiCOH, may be deposited with a layer thickness between about 10 nm and about 20 nm by a PECVD process at a suitable process temperature, such as about 250° C. The carbon doped oxide is then exposed to a hydrogen plasma or an oxygen plasma 90. The plasma treatment demethylates the carbon doped oxide, which results in a low density and porous oxide film forming dielectric layer 76. The use of plasma 90 eliminates any need to rely on a thermal anneal to change the material properties of carbon doped oxide to supply the porosity.

In alternative embodiments of the present invention, dielectric layer 76 may be irradiated with ultraviolet radiation or an electron beam, rather than exposed to plasma 90. For example, the irradiation may break down porogens in the SiOC matrix of SiCOH to porosify SiCOH comprising dielectric layer 76. A separate anneal step is used to sublimate the temporary spacers 72, 74, 72a, 74a, as described with regard to FIG. 6. One advantage of this alternative embodiment is that the porosification of dielectric layer 76 and the conversion of the temporary spacers 72, 74, 72a, 74a to volatile byproducts 82 are decoupled, which simplifies optimization of each process. The sacrificial material is removed without the use of a wet chemical etching process.

Figure 9:
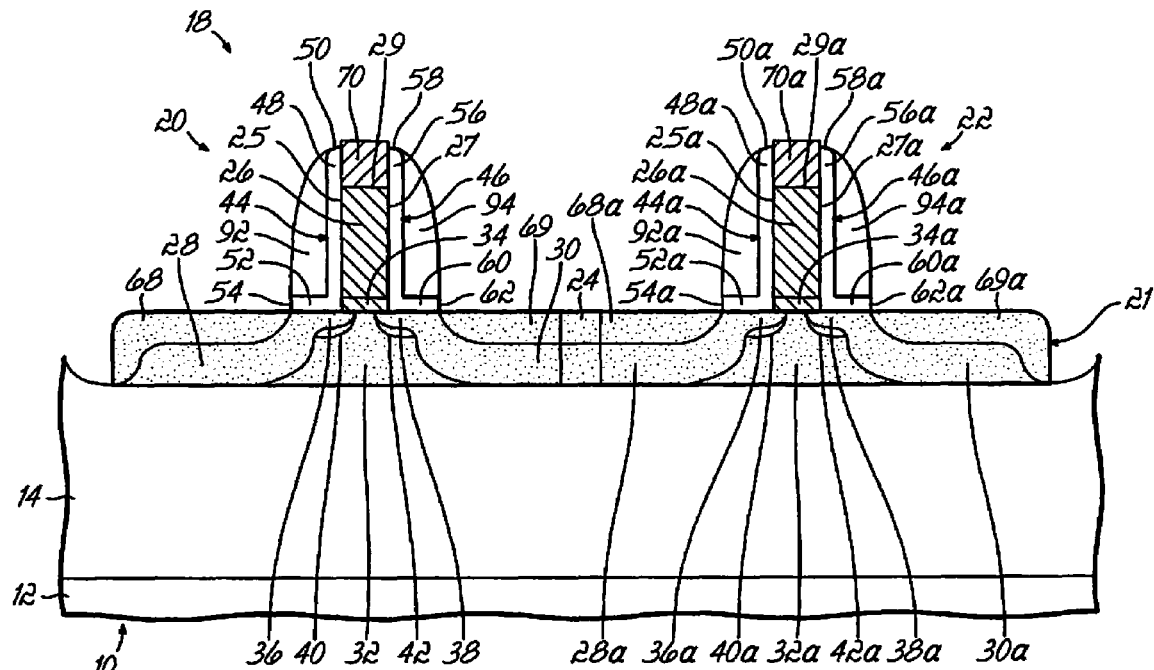
FIGS. 9-15 are diagrammatic cross-sectional views of a portion of a substrate at successive fabrication stages of a processing method in accordance with another embodiment of the present invention.

With reference to FIG. 9 in which like reference numerals refer to like features in FIG. 3 and at a fabrication stage subsequent to FIG. 3 in accordance with an alternative embodiment of the present invention, temporary spacers 92, 94 are formed adjacent to the sidewalls 25, 27 of field effect transistor 20 and temporary spacers 92a, 94a are formed adjacent to the sidewalls 25a, 27a of field effect transistor 22. The temporary spacers 92, 94, 92a, 94a may be formed by depositing a conformal layer of a sacrificial spacer material, which is subjected to a directional anisotropic etching process, such as an RIE process, to form spacers 92, 94 flanking gate electrode 26 and spacers 92a, 94a flanking gate electrode 26a. The material characteristics of the material composing the temporary spacers 92, 94, 92a, 94a are selected such that the material is removable selective to the materials of the nearby exposed structures. The shape and geometrical characteristics of the temporary spacers 92, 94, 92a, 94a are substantially identical to the shape and geometrical characteristics of the temporary spacers 72, 74, 72a, 74a (FIG. 4).

In one embodiment of the present invention, the material constituting the temporary spacers 92, 94, 92a, 94a may be a copolymer resin, which is initially deposited in a liquid form across the surface of the substrate by a spin-coating process. To that end, a mixture of a suitable copolymer resin and an appropriate solvent is dispensed onto the substrate in a predetermined amount and the SOI wafer 10 is rapidly rotated or spun. The spin-on process uniformly distributes the liquid across the SOI wafer 10 by centrifugal forces and results in a uniform applied film of a controlled thickness. The liquid film is solidified by a low-temperature hot plate bake in an inert atmosphere that removes residual solvent and cures the copolymer resin.

A particularly suitable spin-on organic copolymer resin is a spin-on aromatic hydrocarbon like SiLK® commercially available from Dow Chemical Company (Midland, Mich.), although the invention is not so limited. A solution of SiLK® resin in a cyclohexanone/gamma butyrolactone solvent is spun on to form an initial layer having a thickness in the range of approximately 50 nm to approximately 500 nm. The spun-on layer is then cured at about 400° C. to about 450° C. in an inert atmosphere before reactive ion etching to form the temporary spacers 92, 94, 92a, 94a.

Figure 10:
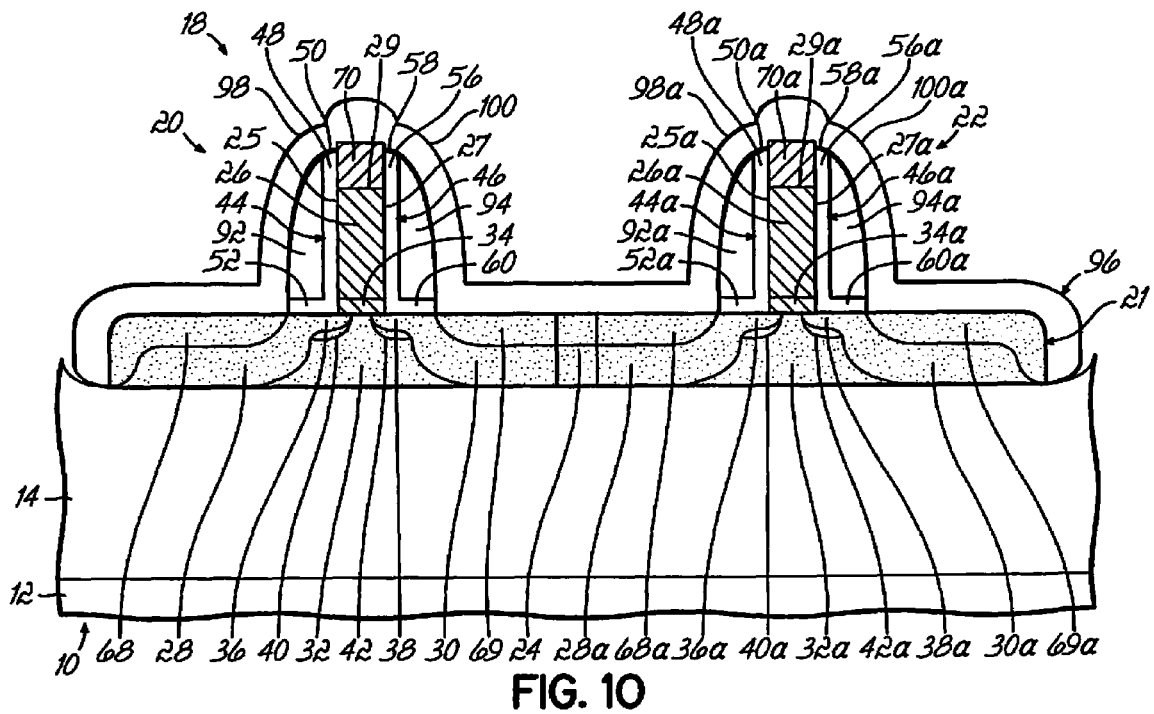

With reference to FIG. 10 in which like reference numerals refer to like features in FIG. 9 and at a subsequent fabrication stage, a stress liner 96 is conformally formed across the transistors 20, 22 and temporary spacers 92, 94, 92a, 94a. The characteristics of the stress liner 96 and the process forming stress liner 96 are substantially identical to the characteristics and formation process for stress liner 88 (FIG. 7).

Stress liner 96 has a curved sidewall portion 98 that extends from the peripheral edge 50 of the vertical portion 48 of spacer 44 to the top surface 15 of SOI region 21 adjacent to the peripheral edge 54 of the lateral portion 52 of spacer 44. Stress liner 96 also has a curved sidewall portion 100 that extends from the peripheral edge 58 of the vertical portion 56 of spacer 46 to the top surface 15 of SOI region 21 adjacent to the peripheral edge 62 of the lateral portion 60 of spacer 46. Similar considerations apply to sidewall portions 98a, 100a, which are structured substantially identical to sidewall portions 98, 100.

Figure 11:
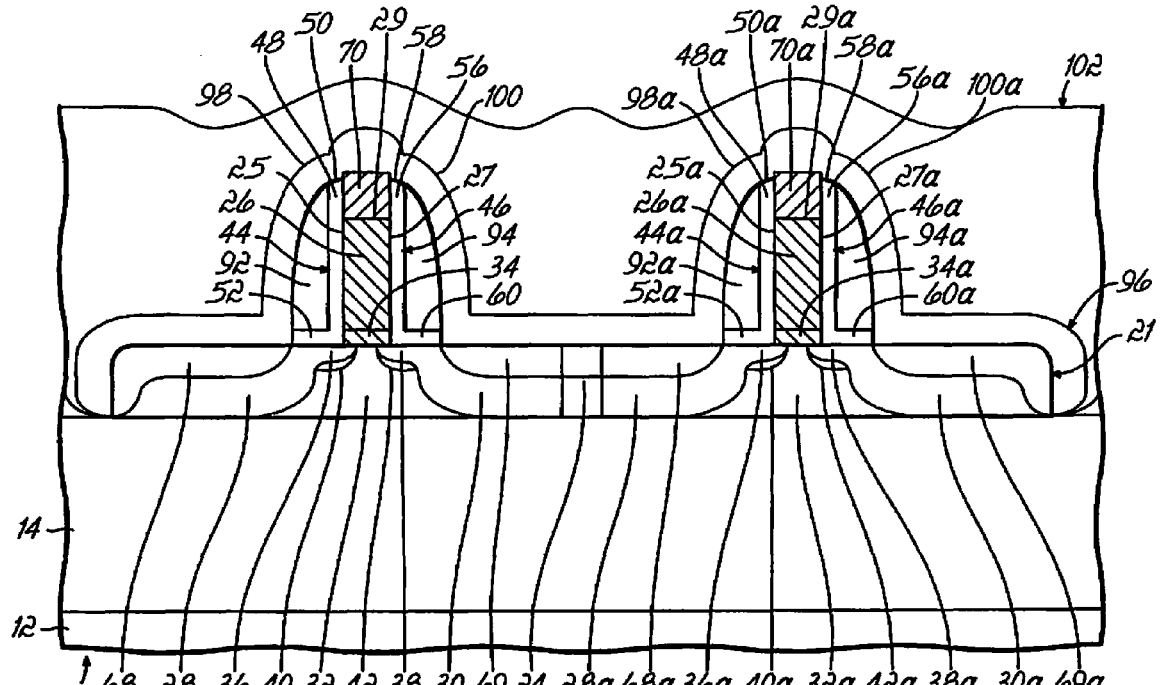

With reference to FIG. 11 in which like reference numerals refer to like features in FIG. 10 and at a subsequent fabrication stage, a layer of a dielectric material 102 is deposited to fill the gap between field effect transistors 20, 22 and the gaps between field effect transistors 20, 22 and adjacent device structures (not shown). Dielectric layer 102 may comprise silicon dioxide having a thickness ranging from about 50 nm to about 200 nm that is deposited by a high density plasma (HDP) process.

Figure 12:
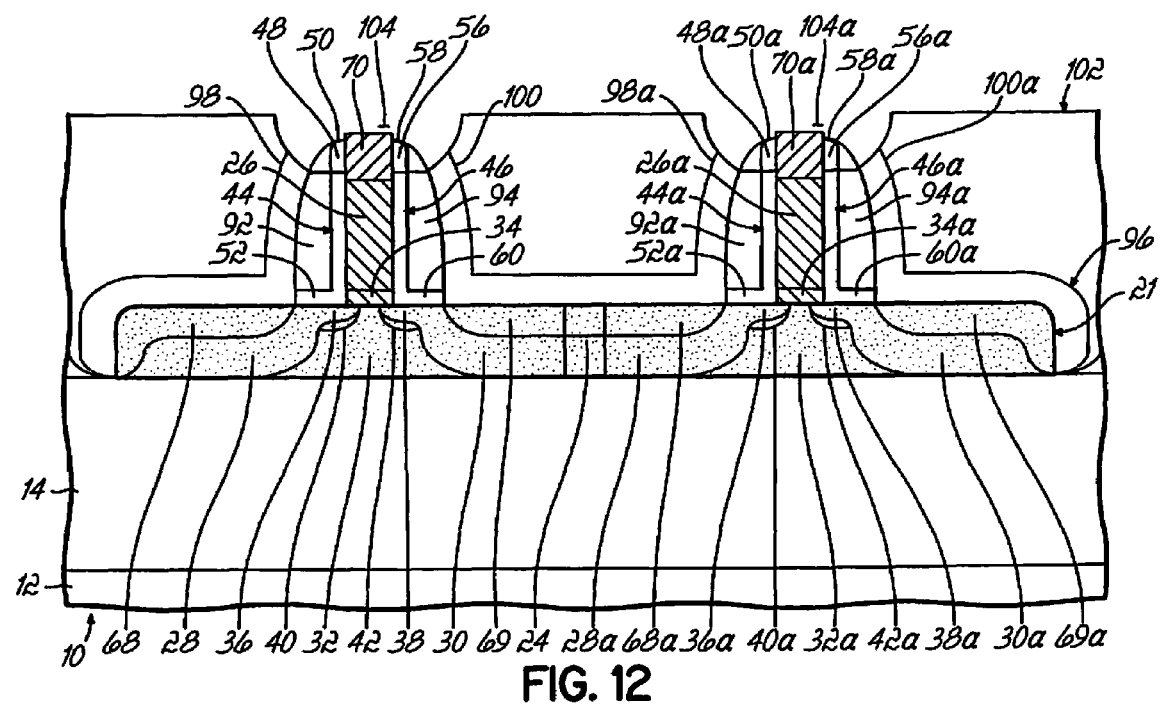

With reference to FIG. 12 in which like reference numerals refer to like features in FIG. 11 and at a subsequent fabrication stage, dielectric layer 102 is planarized using a conventional planarization process, such as a chemical-mechanical polishing (CMP) process, and recessed slightly to partially expose the stress liner 96. The curved sidewall portions 98, 100 of stress liner 96 are partially removed by an appropriate etching process to define a concavity 104 that provides an access path through the stress liner 96 and dielectric layer 102 to temporary spacers 92, 94. A similar concavity 104a intersects the curved sidewall portions 98a, 100a of stress liner 96 for providing an access path through the stress liner 96 and dielectric layer 102 to temporary spacers 92a, 94a.

Figure 13:
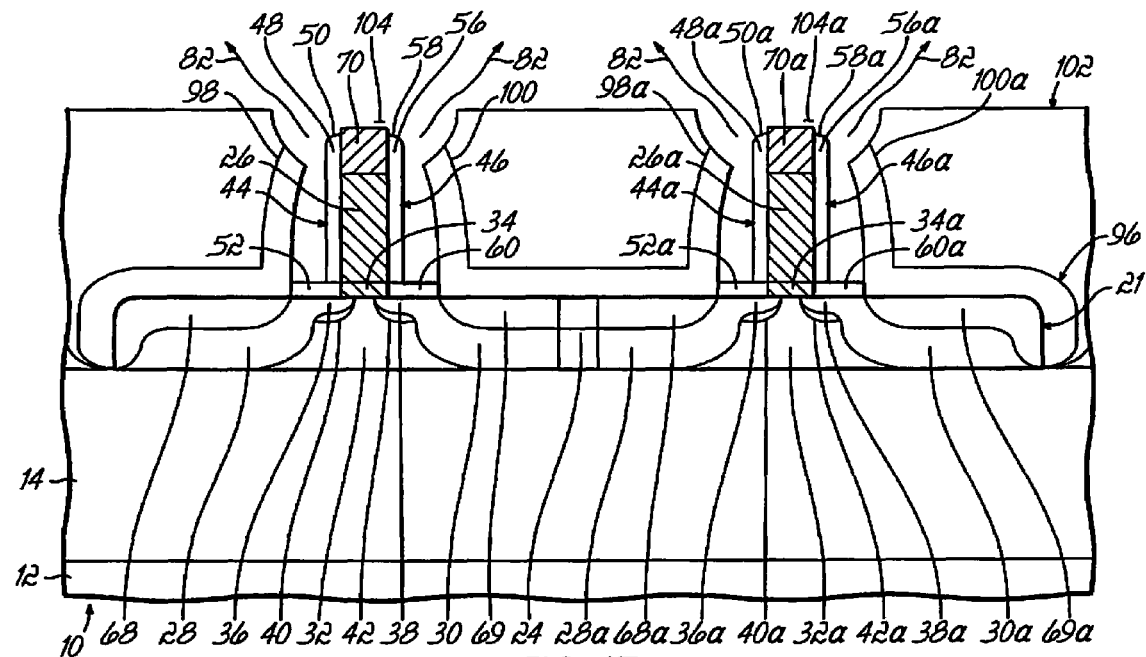

With reference to FIG. 13 in which like reference numerals refer to like features in FIG. 12 and at a subsequent fabrication stage, the sacrificial material constituting the temporary spacers 92, 94, 92a, 94a is selectively removed by, for example, an ashing process using an oxygen-containing plasma. Alternatively, the ashing process may apply an oxygen-free plasma formed from a working gas comprising ammonia ($NH_3$) or a mixture of nitrogen and hydrogen ($N_2/H_2$) to remove the spacers 92, 94, 92a, 94a. The ashing process generally includes generating reactive species from a plasma gas mixture in a plasma asher and exposing the temporary spacers 92, 94, 92a, 94a to the reactive species. The reactive species generated by the plasma from the gas mixture react with carbon and other atoms in the material of the temporary spacers 92, 94, 92a, 94a to form volatile compounds and/or rinse removable compounds. Increasing the substrate temperature is recognized by those having ordinary skill in the art as a method to increase the ashing rate. The ashing process is optimized to have a high selectivity that is greater than 50:1. The sacrificial material is removed without the use of a wet chemical etching process.

Figure 14:
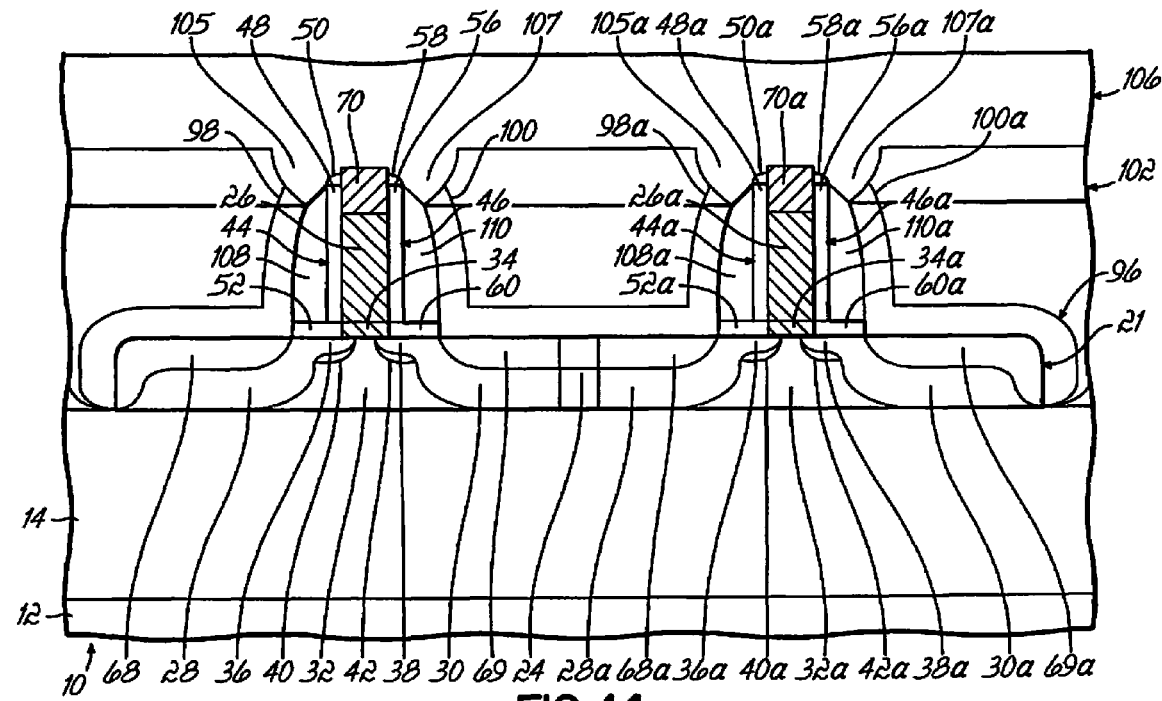

With reference to FIG. 14 in which like reference numerals refer to like features in FIG. 13 and at a subsequent fabrication stage, the volumes formerly occupied by the temporary spacers 92, 94, 92a, 94a are sealed or plugged by the application of an insulator or dielectric fill layer 106 that fills concavities 104, 104a. The dielectric material constituting the fill layer 106 may be tetraethylorthosilicate (TEOS) oxide formed by a CVD process and densified by a subsequent high temperature process. Contact vias (not shown) may be etched through layer 106, which in this instance constitutes a standard layer used to complete the integrated circuit.

The sealed volumes define voids 108, 110 proximate to, and flanking, the sidewalls 25, 27 of gate electrode 26 and voids 108a, 110a proximate to, and flanking, the sidewalls 25a, 27a of gate electrode 26a. A portion 105 of the fill layer 106 cooperates with the residual curved sidewall portion 98 of stress liner 96 to provide a continuous dielectric layer defining a boundary of void 108. Another portion 107 of the fill layer 106 cooperates with the residual curved sidewall portion 100 of stress liner 96 to provide a continuous dielectric layer defining a boundary of void 110. Similar portions 105a, 107a of the filler layer 106 cooperates with the residual curved sidewall portions 98a, 100a of stress liner 96 to provide continuous dielectric layers defining a boundary of voids 108a, 10a, respectively. Voids 108, 110, 108a, 110a are substantially identical in shape and geometrical construction to voids 84, 86, 84a, 86a (FIG. 5).

The cooperation between portion 105 of the fill layer 106 and the residual curved sidewall portion 98 of stress liner 96 is structurally similar to the curved sidewall portion 78 of dielectric layer 76 (FIGS. 5, 6). The cooperation between portion 107 of the fill layer 106 and the residual curved sidewall portion 100 of stress liner 96 is structurally similar to the curved sidewall portion 80 of dielectric layer 76 (FIGS. 5, 6). Similar considerations apply to portions 105a, 107a and residual curved sidewall portions 98a, 100a.

Additional conventional processing, which may include formation of contact vias and studs (not shown), multilayer patterned metallization (not shown), and interlevel dielectrics (not shown), follows to complete the integrated circuit that includes device structure 18.

Figure 15:
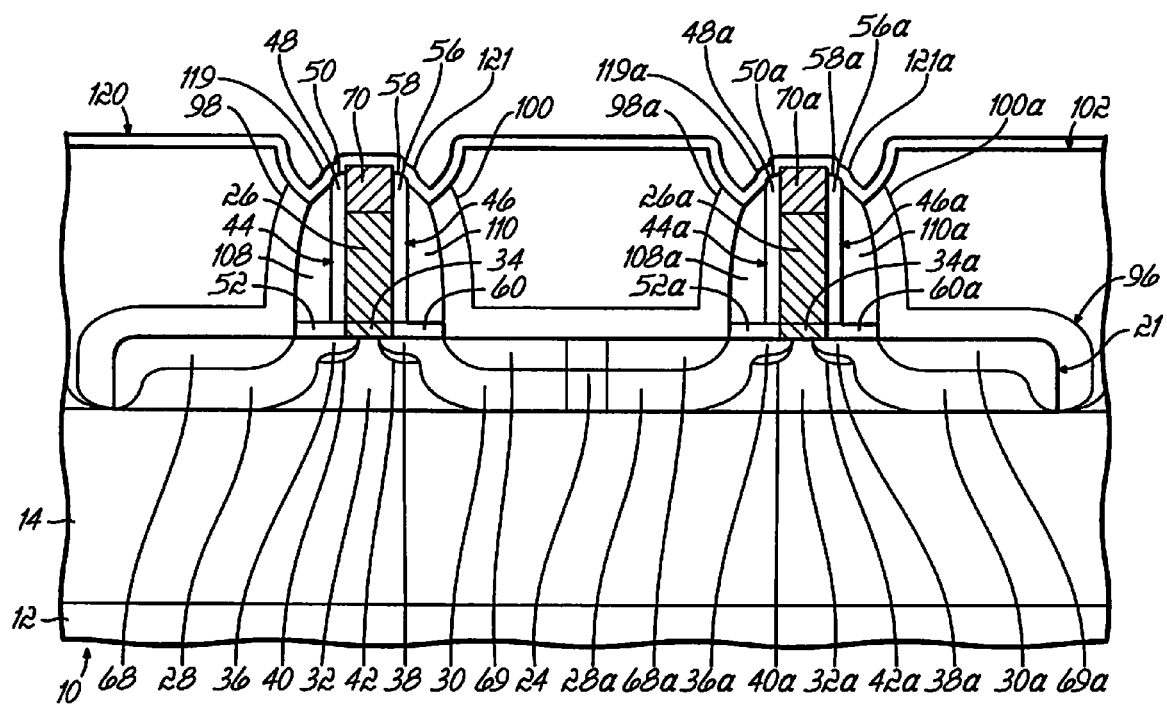

With reference to FIG. 15 in which like reference numerals refer to like features in FIG. 13 and at a subsequent fabrication stage in accordance with an alternative embodiment of the present invention, the sealed spaces defining voids 108, 110, 108a, 110a may be plugged by a thin conformal layer 120 of insulator or dielectric material. A portion 119 of the dielectric layer 120 cooperates with the residual curved sidewall portion 98 of stress liner 96 to provide a continuous dielectric layer defining a boundary of void 108. Another portion 121 of the dielectric layer 120 cooperates with the residual curved sidewall portion 100 of stress liner 96 to provide a continuous dielectric layer defining a boundary of void 110. Similar portions 119a, 121a of the dielectric layer 120 cooperates with the residual curved sidewall portions 98a, 100a of stress liner 96 to form voids 108a, 110a, respectively.

The cooperation between portion 119 of the dielectric layer 120 and the residual curved sidewall portion 98 of stress liner 96 is structurally and functionally similar to the curved sidewall portion 78 of dielectric layer 76 (FIGS. 5, 6). The cooperation between portion 121 of the dielectric layer 120 and the residual curved sidewall portion 100 of stress liner 96 is structurally and functionally similar to the curved sidewall portion 80 of dielectric layer 76 (FIGS. 5, 6). Similar considerations apply to portions 119a, 121a of dielectric layer 120 and residual curved sidewall portions 98a, 100a. The dielectric material constituting layer 120 may be silicon nitride deposited by a CVD process.

A fill layer (not shown) of a different insulator or dielectric material, such as silicon dioxide deposited by a CVD process, is applied, followed by conventional processing to complete the integrated circuit.

References herein to terms such as "vertical", "horizontal", etc. are made by way of example, and not by way of limitation, to establish a frame of reference. The term "horizontal" as used herein is defined as a plane parallel to the top surface 15 of SOI layer 16 and SOI region 21, regardless of its actual three-dimensional spatial orientation. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

The fabrication of the semiconductor structure herein has been described by a specific order of fabrication stages and steps. However, it is understood that the order may differ from that described. For example, the order of two or more fabrication steps may be switched relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method for fabricating a semiconductor device structure on a substrate of semiconductor material, the method comprising:
    forming a gate electrode that includes a top surface and a sidewall extending from the top surface toward the substrate;
    forming a temporary spacer of a sacrificial material adjacent to the sidewall of the gate electrode;
    forming a dielectric layer in a non-porous condition over the temporary spacer;
    converting the dielectric layer from the non-porous condition to a porous condition;
    converting the temporary spacer to volatile byproducts; and
    diffusing the volatile byproducts through the porous dielectric layer to remove the temporary spacer and define a void disposed between the porous dielectric layer and the sidewall of the gate electrode.

2. The method of claim 1 wherein converting the dielectric layer further comprises:
    exposing the dielectric layer to reactive species from a plasma effective to transform the dielectric layer from the non-porous condition to the porous condition.

3. The method of claim 1 wherein converting the dielectric layer further comprises:
    exposing the dielectric layer to a radiation beam effective to transform the dielectric layer from the non-porous condition to the porous condition.

4. The method of claim 1 wherein converting the dielectric layer further comprises:
    heating the dielectric layer to a temperature effective to transform the dielectric layer from the non-porous condition to the porous condition.

5. The method of claim 4 wherein converting the temporary spacer to the volatile byproducts further comprises:
    heating the temporary spacer and the dielectric layer simultaneously to the temperature such that the temporary spacer is converted to the volatile byproducts when the dielectric layer is transformed to the porous condition.

6. The method of claim 1 further comprising:
    forming a stress liner of a dielectric material under compressive stress or tensile stress across the gate electrode and dielectric layer.

7. The method of claim 1 further comprising:
    forming source/drain regions in the semiconductor material of the substrate that flank the gate electrode; and
    before the temporary spacer is formed, forming silicide contacts to the source/drain regions.

8. The method of claim 1 wherein a dielectric spacer is positioned between the void and the sidewall of the gate electrode, and further comprising:
    before forming the temporary spacer, forming the dielectric spacer on at least the sidewall of the gate electrode.

9. A method for fabricating a semiconductor device structure on a substrate of semiconductor material, the method comprising:
    forming a gate electrode that includes a top surface and a sidewall extending from the top surface toward the substrate;
    forming a temporary spacer of a sacrificial material adjacent to the sidewall of the gate electrode;
    forming a dielectric layer over the temporary spacer;
    opening an access path to the temporary spacer through the dielectric layer;
    converting the temporary spacer to volatile byproducts; and
    allowing the volatile byproducts to escape through the access path to remove the temporary spacer and thereby define a void disposed between the dielectric layer and the sidewall of the gate electrode.

10. The method of claim 9 wherein converting the temporary spacer to the volatile byproducts further comprises:
    heating the temporary spacer to a temperature effective to convert the temporary spacer to the volatile byproducts.

11. The method of claim 9 wherein removing the temporary spacer further comprises:
    closing the access path after the void is formed with a dielectric material.

12. The method of claim 11 wherein closing the access path further comprises:
    forming a stress liner of the dielectric material under compressive stress or tensile stress across the gate electrode and the dielectric layer to close the access path.

13. The method of claim 9 wherein opening the access path to the temporary spacer further comprises:
    depositing a fill layer of dielectric material over the gate electrode and substrate;
    removing a portion of the fill layer to expose a portion of the dielectric layer; and
    removing the exposed portion of the dielectric layer to open the access path to the temporary spacer.

14. The method of claim 9 further comprising:
    forming a stress liner of a dielectric material under compressive stress or tensile stress across the gate electrode and dielectric layer.

15. The method of claim 9 further comprising:
    forming source/drain regions in the semiconductor material of the substrate that flank the gate electrode; and
    before the temporary spacer is formed, forming silicide contacts to the source/drain regions.

16. The method of claim 9 wherein a dielectric spacer is positioned between the void and the sidewall of the gate electrode, and further comprising:
    before forming the temporary spacer, forming the dielectric spacer on at least the sidewall of the gate electrode.

17. A method for fabricating a semiconductor device structure on a substrate of semiconductor material, the method comprising:

forming a gate electrode that includes a top surface and a sidewall extending from the top surface toward the substrate;

forming source/drain regions in the semiconductor material of the substrate that flank the gate electrode;

after the source/drain regions are formed, forming a temporary spacer of a sacrificial material adjacent to the sidewall of the gate electrode;

after the source/drain regions are formed, forming a dielectric layer over the temporary spacer; and removing the temporary spacer to define a void disposed between the dielectric layer and the sidewall of the gate electrode.

18. The method of claim 17 wherein the dielectric layer is porous, and removing the temporary spacer further comprises:

converting the temporary spacer to volatile byproducts; and diffusing the volatile byproducts through the porous dielectric layer to form the void.

19. The method of claim 18 wherein converting the temporary spacer to the volatile byproducts further comprises:

heating the temporary spacer to a temperature effective to convert the temporary spacer to the volatile byproducts.

20. The method of claim 18 wherein forming the dielectric layer further comprises:

depositing the dielectric layer in a porous condition.

21. The method of claim 18 wherein forming the dielectric layer further comprises:

converting the dielectric layer from a non-porous condition to a porous condition.

22. The method of claim 21 wherein converting the dielectric layer further comprises:

exposing the dielectric layer to reactive species from a plasma effective to transform the dielectric layer from the non-porous condition to the porous condition.

23. The method of claim 21 wherein converting the dielectric layer further comprises:

exposing the dielectric layer to a radiation beam effective to transform the dielectric layer from the non-porous condition to the porous condition.

24. The method of claim 21 wherein converting the dielectric layer further comprises:

heating the dielectric layer to a temperature effective to transform the dielectric layer from the non-porous condition to the porous condition.

25. The method of claim 24 wherein converting the temporary spacer to the volatile byproducts further comprises:

heating the temporary spacer and the dielectric layer simultaneously to the temperature such that the temporary spacer is converted to the volatile byproducts when the dielectric layer is transformed to the porous condition.

26. The method of claim 17 further comprising:

after the source/drain regions are formed and before the temporary spacer is formed, forming silicide contacts on the source/drain regions.

* * * * *